US011146055B2

United States Patent
Alizadeh et al.

(10) Patent No.: US 11,146,055 B2
(45) Date of Patent: Oct. 12, 2021

(54) METHOD OF COORDINATING AND INCORPORATING AN ELECTRICAL TRANSFORMER STATION BREAKER'S LOW-SET RELAY WITH A RECLOSER IN AN ELECTRIC POWER DISTRIBUTION LINE WITH A FUSE-SAVING SCHEME

(71) Applicants: Omid Alizadeh, Toronto (CA); Bala Venkatesh, Toronto (CA); Gary Thompson, Toronto (CA)

(72) Inventors: Omid Alizadeh, Toronto (CA); Bala Venkatesh, Toronto (CA); Gary Thompson, Toronto (CA)

( * ) Notice: Subject to any disclaimer, the term of this patent is extended or adjusted under 35 U.S.C. 154(b) by 127 days.

(21) Appl. No.: 16/423,600

(22) Filed: May 28, 2019

(65) Prior Publication Data

US 2019/0372330 A1 Dec. 5, 2019

Related U.S. Application Data

(60) Provisional application No. 62/678,001, filed on May 30, 2018.

(51) Int. Cl.
*H02H 1/00* (2006.01)
*H02H 1/04* (2006.01)
(Continued)

(52) U.S. Cl.
CPC .............. *H02H 1/04* (2013.01); *G01R 31/08* (2013.01); *H02H 3/093* (2013.01); *H01H 85/04* (2013.01)

(58) Field of Classification Search
CPC .......... H02H 1/04; H02H 3/093; G01R 31/08; H01H 85/04
See application file for complete search history.

(56) References Cited

U.S. PATENT DOCUMENTS 6,687,573 B2 2/2004 Egolf et al.
7,773,360 B2 8/2010 O'Leary et al.

FOREIGN PATENT DOCUMENTS

JP 2012016255 A * 1/2012
KR 200474994 Y1 * 11/2014

OTHER PUBLICATIONS

D. Thukaram, H.M. Wijekoon Banda, Jovitha Jerome, A robust three phase power flow algorithm for radial distribution systems, Electric Power Systems Research, vol. 50, Issue 3, 1999, pp. 227-236, ISSN 0378-7796 (Year: 1999).*

(Continued)

*Primary Examiner* — Thienvu V Tran
*Assistant Examiner* — Sreeya Sreevatsa
(74) *Attorney, Agent, or Firm* — Langer, Grogan & Diver P.C.

(57) ABSTRACT

A time-current coordination (TCC) curve for a programmable low-set instantaneous overcurrent (IOC) relay for at least one station breaker in an electrical distribution feeder with a fuse-saving scheme and a method of coordinating at least one recloser with the station breaker in the said feeder, for the reduction of frequency of power interruptions encountered by at least one load on the feeder and wherein the method includes the steps of:
  (a) feasible selection of a range for a time delay of a station breaker's programmable low-set IOC relay;
  (b) choosing a time delay based on a fuse-saving relation; and optionally
  (c) locating the recloser on the feeder.

8 Claims, 7 Drawing Sheets

(51) Int. Cl.
    *H02H 3/093*     (2006.01)
    *G01R 31/08*     (2020.01)
    *H01H 85/04*     (2006.01)

(56) References Cited

OTHER PUBLICATIONS

J. Blair, G. Hataway and T. Mattson, "Solutions to common distribution protection challenges," 2016 69th Annual Conference for Protective Relay Engineers (CPRE), College Station, TX, 2016, pp. 1-10, doi: 10.1109/CPRE.2016.7914916 (Year: 2016).*

Blair et al., "Solutions to Common Distribution Protection Challenges", 2018 IEEE Rural Electric Power Conference (REPC), May 6, 2018, pp. 81-91.

GE Power Management—Technical Notes, "Fuse Saving Schemes in Feeder Relays", GET Publication No. GET-8395, 2002, pp. 1-3.

Hussain et al., "An Adaptive Relaying Scheme for Fuse Saving in Distribution Networks With Distributed Generation", IEEE Transactions on Power Delivery, vol. 28, No. 2, Apr. 2013, pp. 669-677.

International Search Report for corresponding PCT Application No. PCT/CA2019/050733 dated Jul. 24, 2019.

* cited by examiner

METHOD OF COORDINATING AND INCORPORATING AN ELECTRICAL TRANSFORMER STATION BREAKER'S LOW-SET RELAY WITH A RECLOSER IN AN ELECTRIC POWER DISTRIBUTION LINE WITH A FUSE-SAVING SCHEME

CROSS-REFERENCE TO RELATED APPLICATIONS

This Non-provisional application claims the benefit under 35 U.S.C. § 119(e) of Provisional Application Ser. No. 62/678,001 filed on May 30, 2018 entitled METHOD OF COORDINATING AND INCORPORATING AN ELECTRICAL TRANSFORMER STATION BREAKER'S LOW-SET RELAY WITH A RECLOSER IN AN ELECTRIC POWER DISTRIBUTION LINE WITH A FUSE-SAVING SCHEME and whose entire disclosure is incorporated by reference herein.

BACKGROUND OF THE INVENTION

This disclosure relates to a method of implementing a recloser in an electric power distribution feeder (or line) for localization of a feeder section containing the fault(s) and reduction of the frequency of power interruptions in a subset or all loads on the feeder, while reducing, preferably minimizing impact on any fuse saving scheme of said feeder during an electrical fault(s). The term "localization" means to isolate the fault.

Electrical distribution is the final stage in the delivery of electricity to end users. The electrical distribution system's network carries electricity from the transmission system via an electrical transformer station (TS) and delivers electricity to a service area including consumers. A radial distribution feeder (or line) leaves an electrical transformer station and passes through the service area with no connection to any other electrical transformer station TS (or electrical supply). Distribution feeders emanating from an electrical transformer station TS are generally controlled by a "station circuit breaker", generally located within the electrical transformer station TS, which will open when an electrical fault is detected along the feeder. A station circuit breaker comprises a circuit breaker, hereinafter referred to as a "station breaker", with a controller to control the station breaker, hereinafter referred to as a "station breaker relay". An electrical fault occurs when a circuit along the feeder is "shorted" due to an unwanted or unexpected event.

A recloser is a protection device which comprises a circuit breaker, hereinafter referred to as a "recloser breaker", with a controller to control the recloser breaker, hereinafter referred to as a "recloser relay". When a fault is detected along the feeder, the recloser relay will detect same and send a "trip" signal to the recloser breaker to disconnect the circuit and interrupt the fault current along the feeder. A "temporary" fault is the type of event that may be caused, for example, when a branch of a tree momentarily touches overhead cables as it falls to the ground, which usually happens around 80 percent of the time. The recloser is able to automatically restore power, by an autoreclosing function of the recloser relay, to the affected section when a temporary fault occurs along the feeder. Typically, for a temporary fault, the recloser allows for power to be restored to customers in a matter of a few seconds or less, for example 0.5 seconds. In the case of a "permanent" fault, wherein the fault has not cleared itself automatically, the recloser keeps the recloser breaker open until the cause of the fault is manually cleared.

Power quality is herein defined as "minimal interruption in power supply to customers". In some instances power quality is compromised. Two such examples are voltage sags along the feeder and momentary power interruptions along the feeder. These examples may not only lead to short-duration shutdown of industrial production processes that are sensitive in nature to the quality of the supplied power, but may also spur a long recovery effort of hours, days, or even weeks to the desired production state prior to the power interruption. An exemplary, but non-limiting, list of industries that may be seriously affected by power quality compromising events is long, including, but not limited to, automobile-manufacturing plants, aerospace, refineries/chemical plants, food-processing facilities, paper mills, precision-machining facilities, pharmaceuticals, semiconductor manufacturers, critical data centers, and many other sectors. Industry losses in productivity and equipment problems due to power quality compromising events are estimated in the range of tens of billions of dollars each year.

With momentary power interruptions accounting for more than half of all interruptions in service from electrical distribution systems, reclosers have the potential to improve quality of power supply to a subset or all customers on a distribution feeder (or line) by reducing these momentary interruptions. Furthermore, reclosers can limit the impact of a service interruption only to the faulted section, can reduce the time necessary to locate and clear the fault, and can prevent additional stress imposed on distribution system assets during the time fault is located.

Reclosers are traditionally used on long transmission and on long feeders; however, employing reclosers on short feeders (typically less than about 10 kilometers in length), especially where a low-set instantaneous overcurrent (IOC) relay is utilized for the electrical transformer station breaker, is limited due to complications in protection coordination. The limitations to accommodate at least one recloser in a feeder with a low-set IOC relay on a station breaker prevents utility companies from taking advantage of the benefits of using reclosers in the feeders, including, but not limited to, a higher quality of power supply to a section of customers by reducing the number of momentary power interruptions to customers.

Accordingly, there is a need for a method to implement a recloser on feeders with a low-set IOC relay on station breaker. Furthermore, there is a need for reclosers implemented on feeders with a low-set IOC relay on station breaker to reduce or isolate the impact of a service interruption to a section of the electrical feeder with a fault, reduce the time to locate and clear the fault, and reduce additional stresses imposed on customers and their related assets during the time fault is located. If properly coordinated with the station breaker, reclosers may shield the customer from power interruptions that otherwise would occur for any fault downstream of the customer.

Also, it is a common practice to use fuses on laterals (branch lines from the feeder that deliver power to the customer) downstream of the transformer station TS. It is thus important that the operation of the autoreclosure function of the station breaker and/or recloser breaker properly coordinates with the fuses in the required manner. These operation modes are typically either "fuse-saving" or "fuse-clearing". Typically, in the fuse-saving mode, the autoreclosure function of the recloser relay and/or station breaker relay is set to initiate one or two trips (for example 0.5 seconds between the two trips) of the corresponding switch (station breaker and/or recloser) before the downstream fuse will blow, and thus open up and break the circuit. If the fuse blows, then it needs to be replaced. Hence, the purpose of the fuse-saving mode is to clear a temporary fault without compromising the fuse along the feeder. If the fault is still present after one or two trips of the breaker (suggesting the fault is permanent rather than temporary), the time between further tripping will be increased allowing the fuse to function as required and blow, disconnecting the affected section along the feeder, and allowing the remaining sections to continue with power supply. In the fuse-clearing mode, the autoreclosure function of the recloser relay and/or station breaker relay is set such that for a fault on a lateral along the feeder, the fuse on the lateral will blow without initiating any autoreclosure action.

Hence, there is also a need for a method of coordinating and incorporating an electrical transformer station breaker's low-set relay with at least one recloser in at least one electric power distribution line with a fuse-saving scheme.

All references cited herein are incorporated herein by reference in their entireties.

BRIEF SUMMARY OF THE INVENTION

According to one aspect, there is provided the use of a recloser in an electric power distribution system for at least one of identifying an electrical fault, in one alternative a temporary fault, in another alternative a permanent fault, on an overhead distribution feeder (or line) referred hereinafter as feeder, identifying an electrical fault on the feeder, and localizing a feeder section containing said fault and combinations thereof. In one alternative, said feeder is a radial feeder, in one alternative, said feeder having a station circuit breaker with a low-set instantaneous overcurrent (IOC) relay and a fuse-saving scheme; said electric power distribution system comprising:
  i) at least one electrical transformer station with at least one station breaker and at least one station breaker relay;
  ii) a feeder line having a first end and a second end, said first end being connected to said at least one electrical transformer station;
  iii) at least one load receiving electricity from said feeder line; and
  iv) at least one recloser situated along said feeder downstream from said at least one load.

According to another aspect, there is provided a time-current coordination (TCC) curve for a low-set IOC relay for at least one station breaker in an electrical distribution feeder with a fuse-saving scheme and a method of coordinating at least one recloser with the station circuit breaker in the said feeder, for the reduction of frequency of power interruptions encountered by at least one load on said feeder, in one alternative, momentary power interruptions in a subset or all loads on said feeder, said feeder comprising at least one recloser for at least one of the following in relation to a fault in the feeder: a) identifying, and b) localizing and combinations thereof, and for c) reducing, preferably minimizing impact on any fuse saving scheme of said feeder during an electrical fault in said feeder in relation to a fuse in the feeder; said method comprising:
  i) optionally locating said at least one recloser on a feeder, preferably downstream of a load on said feeder;
  ii) determining a feasible range of a low-set time delay of said at least one station breaker for reducing the frequency of power interruptions encountered by at least one load on said feeder based on the graph depicted in FIG. 5; and
  iii) further selecting a single value from the range identified in step ii) for said low-set time delay ensuring reduction in impact on said fuse-saving scheme based on the graph depicted in FIG. 7.

In one alternative, said method further comprises locating the recloser on the feeder.

According to yet another aspect, there is provided a method of determining a time delay for a station breaker's low-set IOC relay on a feeder with a fuse-saving scheme for use in coordinating at least one recloser with the station circuit breaker in the said feeder, for reducing the frequency of power interruptions encountered by at least one load on said feeder, in one alternative, momentary power interruptions in a subset or all loads on said feeder, said feeder comprising at least one recloser for at least one of the following in relation to a fault in the feeder: a) identifying said fault on the feeder, and b) localizing a section of the feeder with the fault and combinations thereof, and for c) reducing, preferably minimizing impact on any fuse saving scheme of said feeder during an electrical fault in said feeder in relation to a fuse in the feeder; said method comprising:
  i) optionally locating said at least one recloser on a feeder, preferably downstream of a load on said feeder;
  ii) determining a feasible range of a low-set time delay of said at least one station breaker for reducing the frequency of power interruptions encountered by at least one load on said feeder; and
  iii) further selecting a single value from the range identified in step ii) for said low-set time delay ensuring reduction in impact on said fuse-saving scheme.

According to another aspect of the invention, a protection system for use in an electrical power distribution system that is susceptible to temporary or permanent electrical faults or combinations thereof is disclosed. The system includes a short distribution feeder line and at least one lateral line coupled to the short distribution feeder line, wherein the short distribution feeder line has a first end coupled to at least one electrical transformer station, whereupon electrical power is provided to the short distribution feeder line and the at least one lateral line has at least one fuse. The protection system is configured for localizing an electrical fault in a portion of the electrical power distribution system and comprises: at least one station circuit breaker and at least one station breaker programmable relay located in the short distribution feeder line upstream of the at least one lateral line, wherein the at least one station breaker programmable relay comprises a low-set instantaneous overcurrent relay; at least one recloser breaker and at least one recloser relay located in the short distribution feeder line downstream of the electrical transformer station; and wherein the low-set instantaneous overcurrent relay is programmed with a first predetermined time delay to enable coordination between the at least one station circuit breaker and the at least one recloser breaker to localize an electrical fault located in the at least one lateral line located downstream of the at least one station circuit breaker while minimizing impact on a fuse-saving range of the at least one fuse, the fuse-saving range being defined as a range of currents of an electrical fault that can be localized without the at least one fuse having to open.

According to even further aspect of the invention, a method of implementing a protection system in an electrical power distribution system that is susceptible to temporary or permanent electrical faults or combinations thereof is disclosed. The system includes a short distribution feeder line comprises at least one recloser breaker, at least one recloser relay and at least one lateral line having a fuse. The short distribution feeder line has a first end coupled to at least one electrical transformer station comprising a station circuit breaker and a station breaker relay which comprises a low-set instantaneous overcurrent relay, whereupon electrical power is provided to the short distribution feeder line and the at least one lateral line. The protection system is configured for localizing an electrical fault in a portion of the electrical power distribution system. The method comprises: defining a range of low-set time delays for implementing in the low-set instantaneous overcurrent relay from time current coordination (TCC) curves of the station circuit breaker, the at least one recloser breaker and the fuse; selecting a single low-set time delay value from the range of low set time delays that corresponds to an intersection of a TCC curve of the station circuit breaker with a TCC curve of the fuse based on a minimum coordination time interval (CTI) between the station circuit breaker and the fuse; and implementing the single low-set time delay value into the low-set instantaneous overcurrent relay to localize an electrical fault while minimizing impact on a fuse-saving range of the fuse, and wherein the fuse-saving range is defined as a range of currents of an electrical fault that can be localized without the fuse having to open.

BRIEF DESCRIPTION OF SEVERAL VIEWS OF THE DRAWINGS

Many aspects of the present disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

DETAILED DESCRIPTION OF THE PREFERRED EMBODIMENTS

Figure 1:
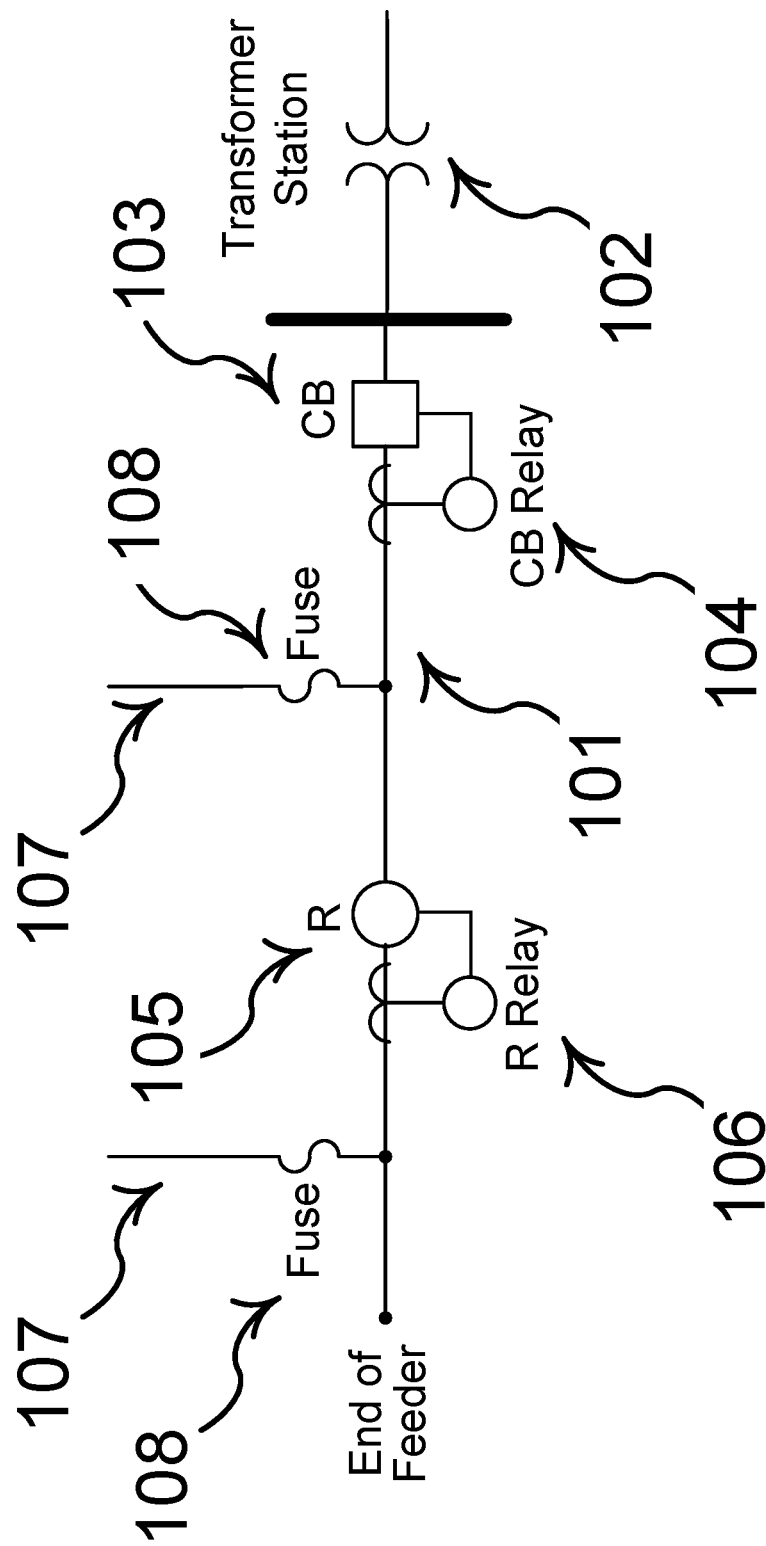
FIG. 1 is a schematic showing a simplified view of an exemplary prior art electric distribution feeder that includes a station circuit breaker and a mid-line recloser.

Referring now to the figures, wherein like reference numerals represent like parts throughout the several views, exemplary embodiments of the present disclosure will be described in detail. Throughout this description, various components may be identified having specific values, these values are provided as exemplary embodiments and should not be limiting of various concepts of the present invention as many comparable sizes and/or values may be implemented.

A design method to coordinate protection settings of at least one station breaker's low-set instantaneous overcurrent (IOC) relay with at least one recloser relay to reduce the frequency of power interruptions in a subset or all loads on said feeder, while reducing, preferably minimizing impact on any fuse-saving scheme of said feeder during electrical short-circuit faults. To accommodate reclosers into a feeder such that faults are identified and the feeder section containing said fault is localized, the settings of the station breaker's low-set IOC relay are required to be re-programmed. For this purpose, the disclosed design method enables the protection engineer to implement a time-current coordination (TCC) curve for a station breaker's low-set IOC relay and to choose the time delay on the station breaker's low-set IOC relay settings, referred hereinafter as low-set time delay (and settings), to coordinate with mid-line reclosers while respecting all operating constraints and minimizing impact on the fuse-saving scheme. This allows utilities to now place reclosers on feeders with a fuse-saving scheme and, therefore, enhance quality of power supply to customers.

As just mentioned, the purpose of the fuse-saving practice on feeders is to clear temporary faults on laterals without compromising the fuses. This can result in less fuse replacement requirements. Fuse saving is achieved by opening the station breaker/recloser before the fuse blows in the first (and second) attempt after a fault occurs, to give the fault a chance to clear without melting the fuse, in the case that the fault is temporary. If the fault is permanent, then the station breaker/recloser is switched to its slow curve so that the fuse melts and breaks the circuit before the breaker/recloser responds. Employing a mid-line recloser reduces this fuse-saving range which results in a smaller number of fuses "being saved" from replacements for temporary faults on the laterals. However, the present invention, as will be discussed below in detail, provides a method whereby the impact of the mid-line recloser on the fuse-saving range is minimized.

Referring now to FIG. 1, there is depicted a simplified view of an exemplary electric distribution feeder that includes a station circuit breaker and a mid-line recloser. The example feeder 101 is supplied from a step-down transformer station 102. The station breaker 103, which can open or close the feeder to isolate a fault on the feeder from its source, and its protective relay 104 are located at the beginning of the feeder. The automatic recloser breaker 105 and its recloser relay 106 are located proximate the middle of the feeder 101. The recloser relay 106 may be set to perform up to three automatic recloser operations. There are also laterals 107 along the feeder 101 which supply the customers connected to them and are protected by fuses 108, located at the beginning of the feeder 101, against short-circuit faults. The depiction of the number of laterals 107 in FIG. 1 is arbitrary and there may be many different configurations and virtually any number of laterals 107 in any given distribution feeder 101.

Effective location of a recloser on a radial distribution line for reducing momentary interruptions to the customers depends on various factors including:

1. The portion of total customers on the feeder that are desired to be located between the station circuit breaker and the recloser for which it is aimed to reduce their momentary interruptions by installing the recloser,
2. Restrictions on the available locations on the feeder that can accommodate a recloser and its recloser relay,
3. Location of any specific critical customers on the feeder for which it is aimed to reduce their momentary interruptions by installing the recloser; in this case, the recloser may be located downstream to the critical customer to reduce the momentary interruptions due to the reclosing practice on the feeder,
4. Location of maximum number of fault incidents on the feeder and their types and duration; in this case, the recloser may be located upstream to the aforementioned critical location to reduce the momentary interruptions due to the reclosing practice on the feeder for the loads located between the station breaker and the recloser.

Hence, in one alternative, the final location of the recloser is chosen based on a compromise of the aforementioned factors.

Figure 2:
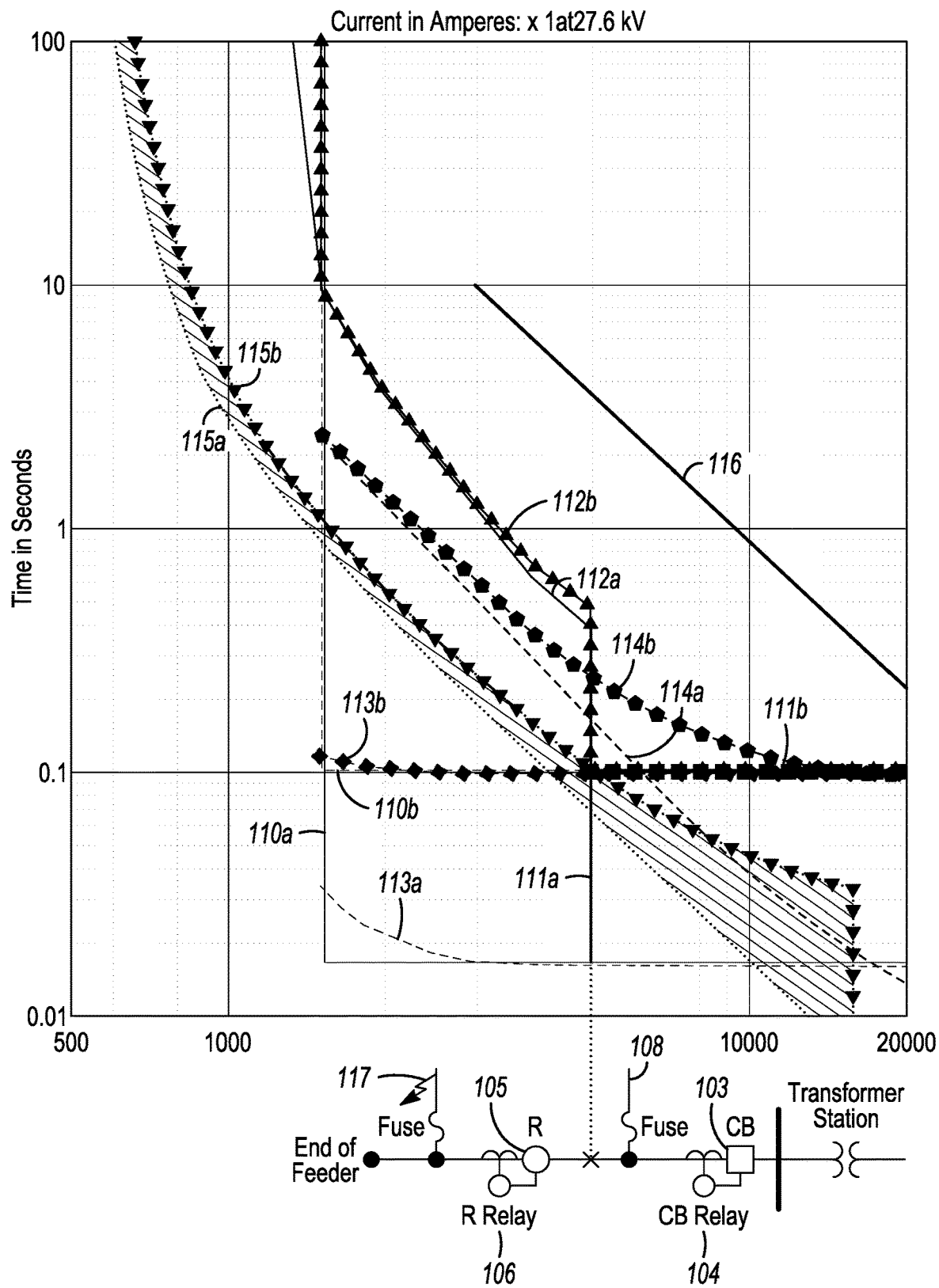
FIG. 2 is a plot illustrating exemplary prior art time-current coordination curves of feeder protection devices with conventional settings.

Referring now to FIG. 2, there is depicted a plot illustrating exemplary TCC curves of feeder protection devices with conventional settings. The schematic of the feeder is also shown at the bottom of FIG. 2. The TCC curves establish the fault protection parameters and hence the fault operating characteristics of the protective devices on the feeder. FIG. 2 illustrates a set of TCC curves 110a, 111a, and 112a which illustrate three different characteristics of the protective relay 104 of the station breaker 103. 110a and 110b are the nominal response time and maximum clearing (interrupting) time of the station breaker's low-set IOC relay 104. 111a and 111b are the nominal response time and maximum clearing (interrupting) time of the station breaker's high-set IOC relay. The location indicated by "x" at the feeder in FIG. 2 is the location where a three-phase solid fault (a short-circuit fault with zero fault impedance) would result in a fault current equal to the corresponding value on curve 111a, as shown in the FIGS. 112a and 112b are the nominal response time and maximum clearing (interrupting) time of the station breaker's timed-overcurrent (TOC) relay. Also, TCC curves 113a and 114a illustrate two different characteristics of the recloser relay 106 of the automatic recloser 105. 113a and 113b are the nominal response time and maximum clearing (interrupting) time of the recloser relay's fast curve and 114a and 114b are the nominal response time and maximum clearing (interrupting) time of the recloser relay's slow curve. TCC curves 115a and 115b illustrate the minimum melting time and the maximum clearing time of an exemplary lateral fuse, respectively. TCC curve 116 illustrates the thermal overcurrent (short-circuit) damage criterion of the most critical equipment on the feeder which typically could be the underground cable portion at the beginning of the feeder, overhead lines or station transformer. As best seen in FIG. 2, that there is no coordination between the breaker 110a curve and recloser 113a curve. Consequently, in case of a fault at location 117 (shown in FIG. 2) downstream to recloser 105, both station breaker relay 110a and recloser relay 113a respond to the fault and send corresponding trip signals to devices 103 and 105. Hence, the entire feeder will be de-energized in response to fault 117.

Figure 3:
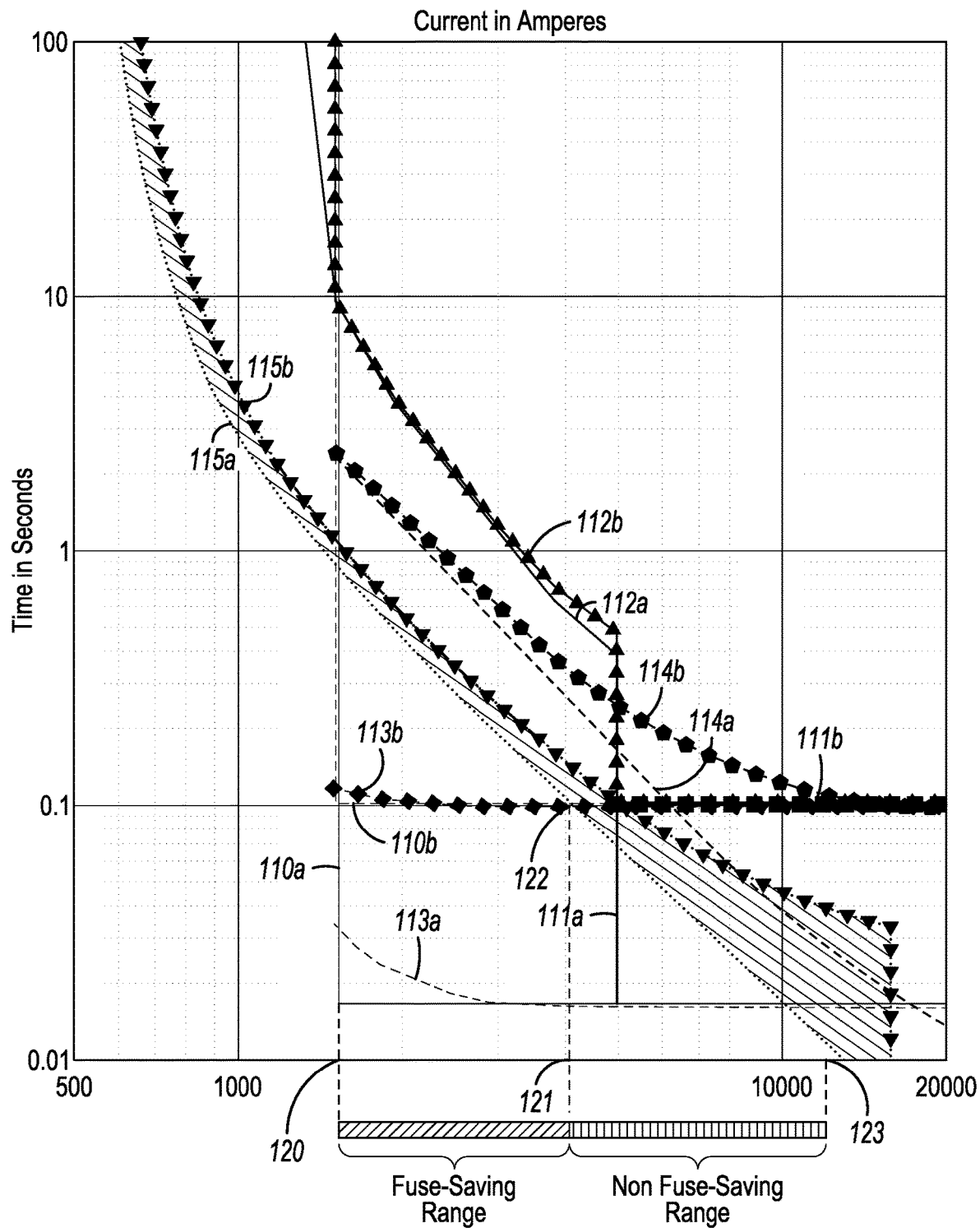
FIG. 3 is a plot illustrating the range of fuse saving function on an exemplary prior art feeder with the conventional settings on the low-set IOC relay.

Referring now to FIG. 3, there is depicted a range of fuse saving function on an exemplary feeder with the conventional settings on the low-set IOC relay 104. The range of fuse-saving function is from the pick-up current 120 of the low-set relay to the current value 121 corresponding to the point of intersection of the low-set curve 110b and the fuse curve 115a, point 122. For the rest of the area on the right-hand side of point 121 up to maximum fault current at the transformer station 123 (i.e., fault current due to a three-phase-to-ground bolted fault at the station), the fuse cannot be saved from melting since the fuse starts to melt before the station breaker opens its contacts and interrupts the fault current.

Figure 4:
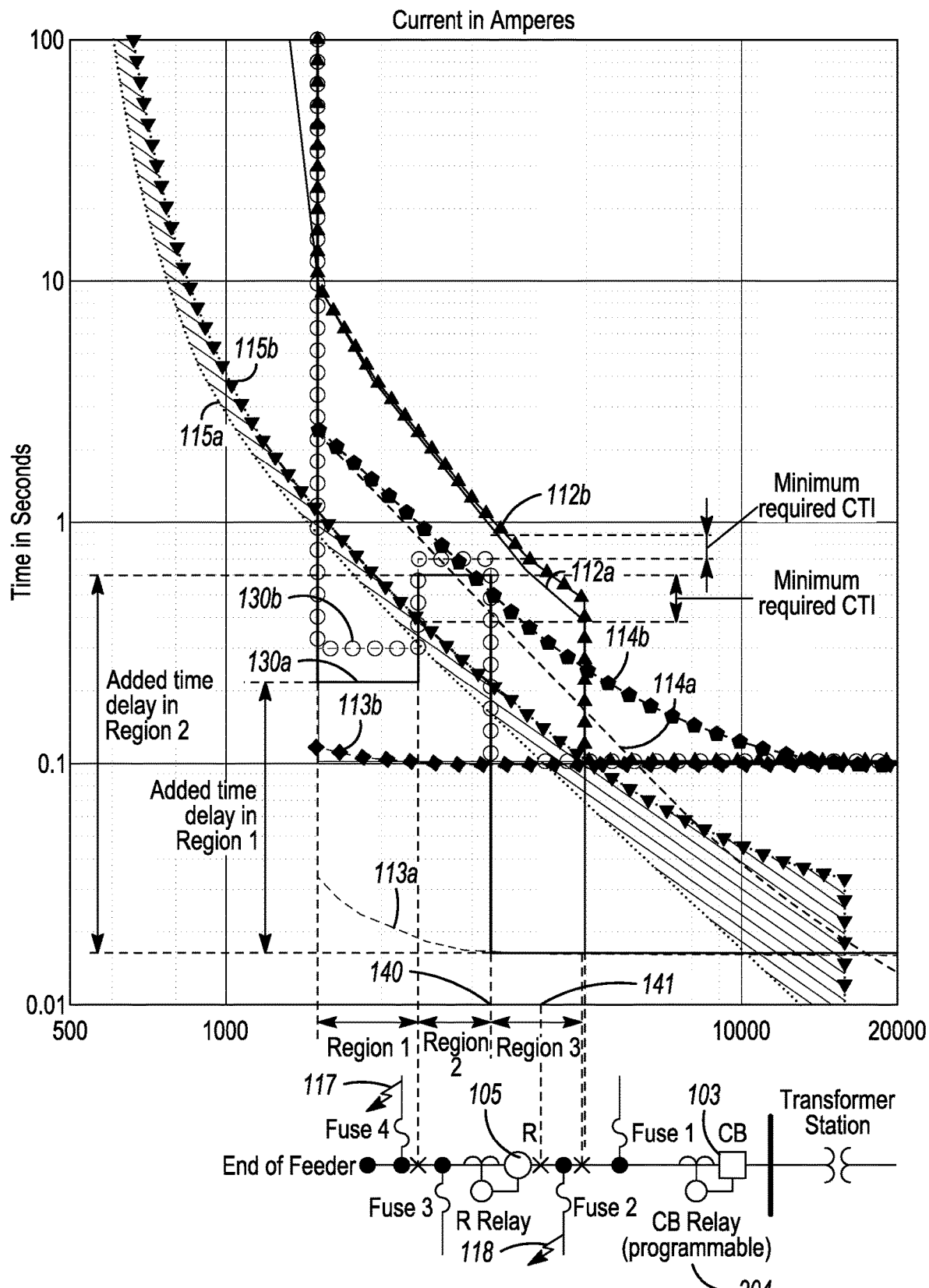
FIG. 4 is a plot illustrating exemplary time-current coordination curves of feeder protection devices with settings of low-set IOC relay according to the present invention.

Referring now to FIG. 4, there is depicted a plot illustrating exemplary TCC curves of feeder protection devices with the proposed settings of a programmable low-set IOC relay 204. This relay 204 is a microprocessor-based relay wherein the parameters of the low-set IOC relay, including a time-delay, can be set within a wide range when the relay 204 is being programmed. The proposed setting for the station breaker's low-set IOC relay consists of three current regions as explained in the following. In current region 1 illustrated in FIG. 4, a time delay is added to the low-set relay's response time curve 130a to enable the coordination of the station circuit breaker 103 with the mid-line recloser 105. Therefore, with the added time delay in current region 1, in case of a fault downstream to the recloser location (e.g. a fault at location 117), the recloser relay's fast curve 113a will respond to the fault first and sends a trip signal to the recloser breaker. It is shown in FIG. 4 that, in current region 1, the recloser's total clearing time 113b occurs before the new response time of the low-set relay, curve 130a. Current region 1 expands from the pickup value of low-set relay to the point of intersection of the low-set relay's total clearing curve 130b and the exemplary fuse curve 115a. Hence, for a fault on the example feeder that is located upstream to the recloser (e.g. a fault at location 118 in FIG. 4) where the fault current falls within current region 1, the clearing time of the breaker occurs before the minimum melting curve of the example fuse (fuse 2 in FIG. 4) is reached and therefore fuse-saving can be achieved for this fuse. In current region 2 illustrated in FIG. 4, the fuse saving cannot be achieved any further for a fault on the example feeder that is located upstream to the recloser (e.g., a fault at location 118 in FIG. 4, located downstream to Fuse 2) where the fault current falls within current region 2. This is because with the added time delay in current region 1 (to enable coordination with the mid-line recloser) the clearing time 130b of the low-set relay 204 has already reached the minimum melting time curve 115a of the Fuse 2. Hence, in the curve, the time delay in current region 2 is further increased beyond the fuse clearing time curve 115b (but below the combination of TOC relay and high-set IOC relay) to allow the fuse to fully melt before the breaker response curve 113a is reached. According to electric utility's protection philosophy, a minimum coordination time interval (CTI) is typically required between the TCC curves of the devices in series (e.g., recloser 105 and station breaker 103, or a lateral fuse (e.g., Fuse 1 or Fuse 2) and station breaker 103); in this case, there is a minimum required CTI at the beginning of current region 2 between the fuse curve 115b and curve 130a, and another minimum required CTI at the end of current region 2 between curve 130b and curve 112a. Hence, current region 2 expands from the intersection of curves 130b and 115a to point 140 (i.e., the point of minimum required CTI between curves 130b and 112a) or point 141 (i.e., the point of the fault current value for a three-phase-to-ground bolted fault at the recloser location), whichever is smaller. Consequently, if the fault is located beyond the lateral fuse (e.g. a fault at location 118), the fault will be cleared by the fuse and there won't be any interruption to the rest of the customer loads on the feeder because the station breaker 103 will not be tripped. Furthermore, as shown in FIG. 4, if the fault current for an example fault event falls within current region 3, the location of the fault is certainly upstream to the location of the recloser 105 and therefore the station breaker 103 should be tripped as quickly as possible to interrupt the high current fault; in other words, no coordination is required between the breaker 103 and recloser 105 in this area. Hence, no time delay is added to the response time of the low-set relay, curve 130a, at the station breaker relay 204, in current region 3.

The following is an example of the method to determine the added time delay on the low-set relay, in one alternative, in current region 1, consisting of two steps as follows:

Step One: Feasible Selection Range for the Low-Set Time Delay

Figure 5:
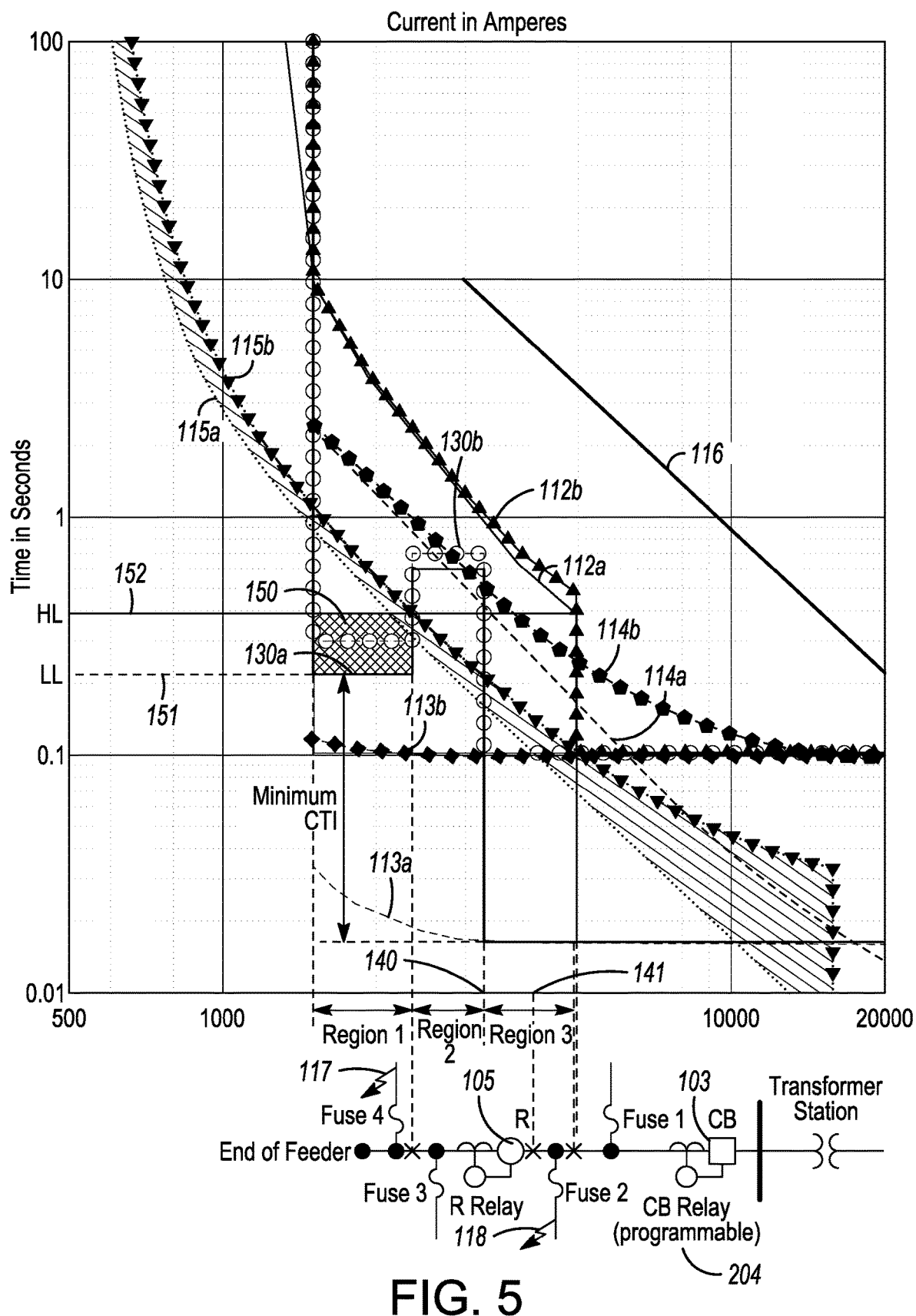
FIG. 5 illustrates the exemplary feasible range for selecting the added time delay on station breaker's low-set relay according to the present invention.

Referring now to FIG. 5, there is illustrated an exemplary feasible range 150 for selecting the added time delay on low-set relay in current region 1. The derivation of this feasible area is explained in the following. The electric utility company's protection philosophy dictates to maintain a minimum amount of CTI between two protective devices located in series to each other on a feeder (for instance, recloser 105 and station breaker 103, or a lateral fuse (for instance, Fuse 1) and station breaker 103, in order to compensate for the interrupting time of the downstream device and the potential discrepancies in equipment TCC curves, current measurements, and system data. Therefore, the added time delay on the low-set relay 204 of the station breaker 103 should be at least equal to the minimum CTI to provide the required coordination time. This is the lowest value of low-set time delay (LL) 151, as illustrated in FIG. 5. Further, the highest available value of low-set time delay (HL) 152 is when the station breaker interrupts before the equipment damage curve 116 is violated or the TOC curve of the station breaker 112a is reached (typically the latter is reached first). The difference between the highest and lowest values of low-set time delay is the feasible selection range of the low-set time delay, area 150.

Step Two: Choosing the Low-Set Time Delay Based on the Fuse-Saving Relation

Figure 6:
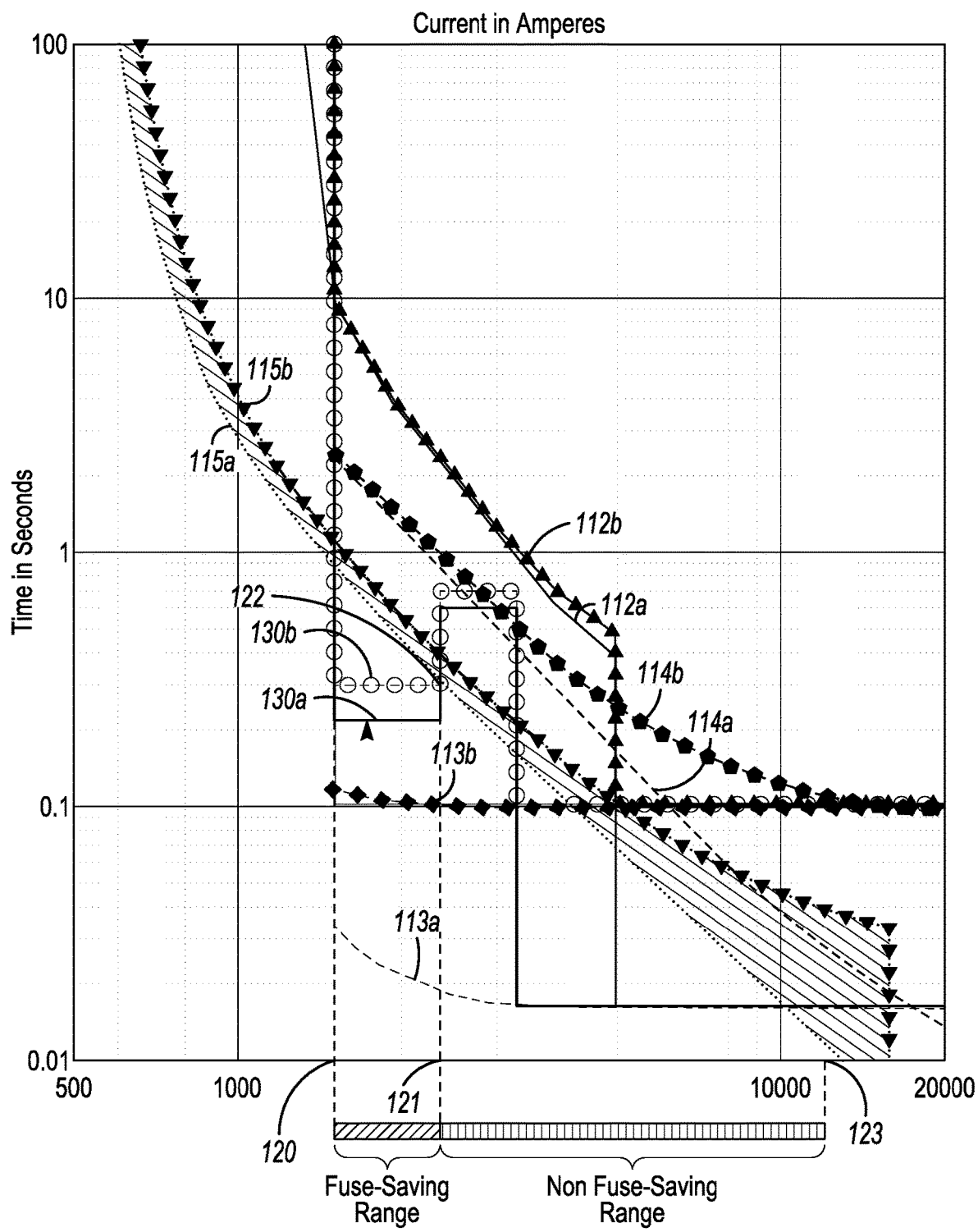
FIG. 6 is a plot illustrating the exemplary range of fuse saving function on the feeder with the proposed settings on the low-set IOC relay according to the present invention.

Referring now to FIG. 6, there is shown an exemplary range of fuse saving function on the feeder with the proposed settings on the low-set IOC relay 204. The range of fuse-saving function for fuses located upstream to the recloser (e.g. fuse 2 in FIG. 4) is from the pick-up current 120 of the low-set relay 204 to the current value 121 corresponding to the point of intersection of the proposed low-set curve 130b and the fuse curve 115a, point 122. For the rest of the area on the right-hand side of point 121 up to maximum fault current at the transformer station 123 (i.e., fault current due to a three-phase-to-ground bolted fault at the station), the fuse cannot be saved from melting since the fuse starts to melt before the breaker opens its contacts and interrupts the fault current. It is observed that the fuse-saving range in FIG. 6 is smaller than the one in FIG. 3 (prior art conventional settings). The change in the range of fuse-saving function on the feeder due to introducing the added time delay on the low-set relay 204 can be evaluated in the fuse-saving graph shown in FIG. 7, an improved method described in this disclosure.

Figure 7:
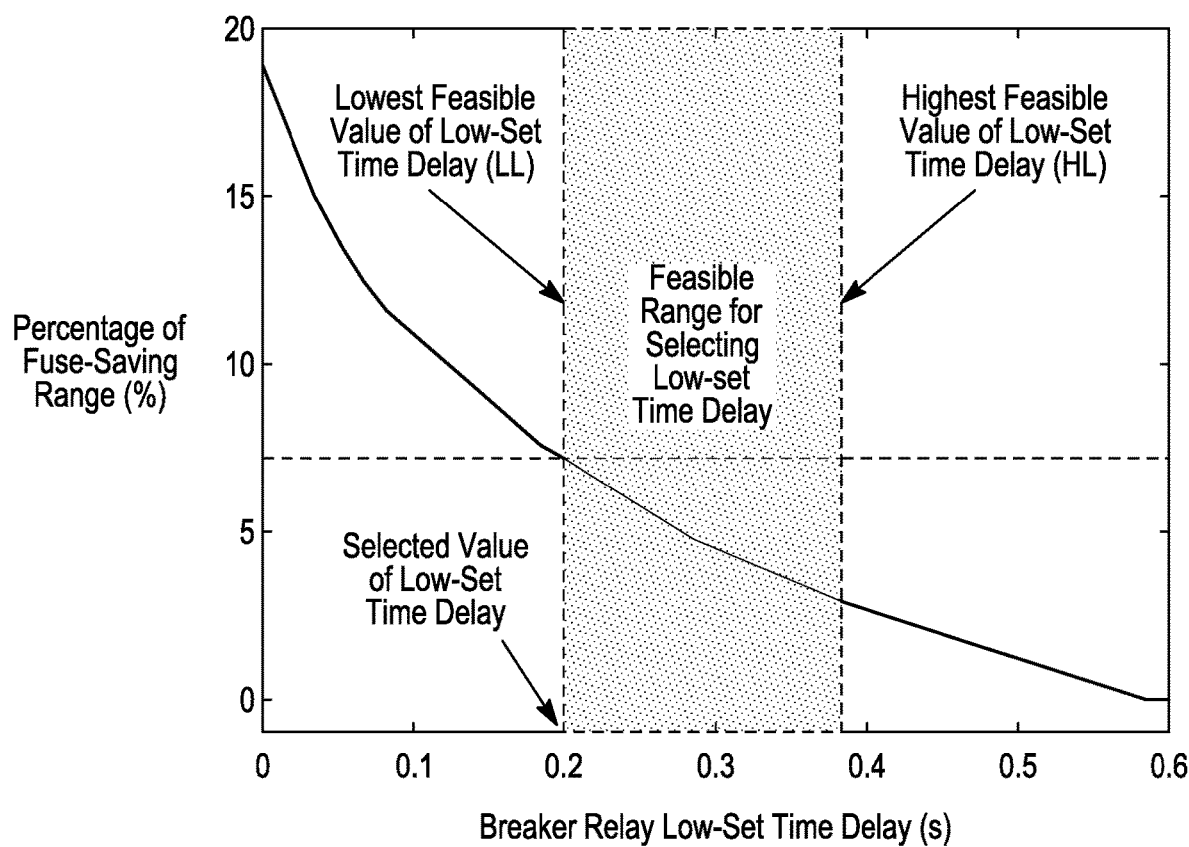
FIG. 7 illustrates the exemplary range of fuse-saving function for an example lateral fuse in percentage of the overall fault current range at the feeder according to the present invention.

Referring now to FIG. 7, there is illustrated the range of fuse-saving function for an example lateral fuse (e.g. fuse 2 in FIG. 4) in percentage of the overall fault current range at the feeder. The fault current range is assumed to be between the current pickup value of the station breaker's low-set IOC relay 204 and the maximum fault current at the station. It is observed in FIG. 7 that initially, with no time delay, the fuse-saving range for the example fuse is higher. With an added value of low-set time delay, the fuse-saving range reduces. Therefore, it is observed that increasing the low-set time delay results in decreasing the range of fuse-saving function for the customers located upstream to the recloser. Hence, the least possible value of time delay on the low-set relay, LL, is chosen to minimize impact on the fuse-saving range.

The outcome of this step is that the protection engineer will be enabled to choose the proper low-set time delay for accommodating reclosers while respecting all operating constraints and minimizing impact on fuse-saving scheme.

While the invention has been described in detail and with reference to specific examples thereof, it will be apparent to one skilled in the art that various changes and modifications can be made therein without departing from the spirit and scope thereof.

What is claimed is:

1. A protection system for use in an electrical power distribution system that is susceptible to temporary or permanent electrical faults or combinations thereof, said system including a short distribution feeder line and at least one lateral line coupled to the short distribution feeder line, the short distribution feeder line having a first end coupled to at least one electrical transformer station, whereupon electrical power is provided to the short distribution feeder line and the at least one lateral line having at least one fuse, said protection system being configured for localizing an electrical fault in a portion of the electrical power distribution system and comprising:

at least one station circuit breaker and at least one station breaker programmable relay located in said short distribution feeder line upstream of said at least one lateral line, said at least one station breaker programmable relay comprising a low-set instantaneous overcurrent relay;

at least one recloser breaker and at least one recloser relay located in said short distribution feeder line downstream of said electrical transformer station; and wherein said low-set instantaneous overcurrent relay is programmed with a first predetermined time delay to enable coordination between said at least one station circuit breaker and said at least one recloser breaker to localize an electrical fault located in said at least one lateral line located downstream of said at least one station circuit breaker while minimizing impact on a fuse-saving range of said at least one fuse, said fuse-saving range being defined as a range of currents of an electrical fault that can be localized without said at least one fuse having to open.

2. The system of claim 1, wherein operation of each of said breakers and fuses is defined by a respective time current coordination curve, said first predetermined time delay being implemented in said low-set set instantaneous overcurrent relay to permit a total clearing time of said at least one recloser breaker to occur before a response time of said low-set set instantaneous overcurrent relay when the electrical fault occurs downstream of said at least one recloser breaker.

3. The system of claim 2, wherein said low-set instantaneous overcurrent relay is configured to provide a second predetermined time delay, greater than said first predetermined one time delay, to permit a fuse in a lateral line upstream of the recloser to open before a trip point of said at least one recloser relay is reached when the electrical fault occurs upstream of said at least one recloser breaker.

4. The system of claim 1 wherein said short distribution feeder comprises a radial feeder.

5. A method of implementing a protection system in an electrical power distribution system that is susceptible to temporary or permanent electrical faults or combinations thereof, said system including a short distribution feeder line comprising at least one recloser breaker, at least one recloser relay and at least one lateral line having a fuse, the short distribution feeder line having a first end coupled to at least one electrical transformer station comprising a station circuit breaker and a station breaker relay comprising a low-set instantaneous overcurrent relay, whereupon electrical power is provided to the short distribution feeder line and the at least one lateral line, said protection system configured for localizing an electrical fault in a portion of the electrical power distribution system, said method comprising:
 defining a range of low-set time delays for implementing in said low-set instantaneous overcurrent relay from time current coordination (TCC) curves of said station circuit breaker, said at least one recloser breaker and said fuse;
 selecting a single low-set time delay value from said range of low set time delays that corresponds to an intersection of a TCC curve of said station circuit breaker with a TCC curve of said fuse based on a minimum coordination time interval (CTI) between said station circuit breaker and said fuse; and
 implementing said single low-set time delay value into said low-set instantaneous overcurrent relay to localize an electrical fault while minimizing impact on a fuse-saving range of the fuse, said fuse-saving range being defined as a range of currents of an electrical fault that can be localized without the fuse having to open.

6. The method of claim 5 wherein said step of defining a range of low-set time delays comprises:
 identifying a CTI between two any two breakers or fuses in series to establish a minimum low-set time delay value;
 determining a maximum low-set time delay value based upon when said station circuit breaker interrupts current flow before an equipment damage curve of a corresponding equipment TCC curve is reached;
 defining said range as the time period between said minimum low-set time delay value and said maximum low-set time delay value.

7. The method of claim 5 wherein said step of defining a range of low-set time delays comprises:
 identifying a CTI between two any two breakers or fuses in series to establish a minimum low-set time delay value;
 determining a maximum low-set time delay value based upon when said station circuit breaker interrupts current flow before a time overcurrent (TOC) curve of said station circuit breaker is reached;
 defining said range as the time period between said minimum low-set time delay value and said maximum low-set time delay value.

8. The method of claim 5 wherein said short distribution feeder comprises a radial feeder.

* * * * *